(12) United States Patent  
Humphrey et al.

(10) Patent No.: US 6,683,482 B2  
(45) Date of Patent: Jan. 27, 2004

(54) SLEW RATE CONTROL OF OUTPUT DRIVERS USING PVT CONTROLLED EDGE RATES AND DELAYS

(75) Inventors: Guy Harlan Humphrey, Fort Collins, CO (US); Laurent F. Pinot, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/920,889

(22) Filed: Aug. 2, 2001

(65) Prior Publication Data

US 2003/0025541 A1 Feb. 6, 2003

(51) Int. Cl.$^7$ .................................................. H03K 5/12
(52) U.S. Cl. ......................... 327/170; 327/112; 326/26; 326/32

(58) Field of Search ........................ 327/108–112, 170, 327/374–378, 379, 384, 389, 391, 387, 362; 326/17, 112, 20, 23–28, 31, 32, 34, 82–92, 30, 121, 49, 50; 370/412

(56) References Cited

U.S. PATENT DOCUMENTS

| | | | | |
|---|---|---|---|---|
| 4,785,203 A | * | 11/1988 | Nakamura | 326/121 |
| 4,894,561 A | * | 1/1990 | Nogami | 326/27 |
| 4,975,598 A | * | 12/1990 | Borkar | 326/121 |
| 5,214,320 A | * | 5/1993 | Truong | 326/27 |
| 5,581,197 A | | 12/1996 | Motley et al. | 326/30 |
| 5,986,489 A | * | 11/1999 | Raza et al. | 327/170 |

* cited by examiner

*Primary Examiner*—Minh Nguyen (57) ABSTRACT

A novel method and apparatus is presented for reducing the slew rate of transition edges of a digital signal on a node of an integrated circuit by adjusting the source resistance of the pre-drive devices to generate a slew-controlled pre-drive signal for driving the output drive devices.

8 Claims, 5 Drawing Sheets

SLEW RATE CONTROL OF OUTPUT DRIVERS USING PVT CONTROLLED EDGE RATES AND DELAYS

FIELD OF THE INVENTION

The present invention relates generally to integrated circuit pad circuits, and more particularly to controlling the slew rate of output drivers using external resistance and programmed delays.

BACKGROUND OF THE INVENTION

Integrated circuits communicate with one another using digital signals. In the digital world, a digital signal may be in one of a plurality of predefined quantized states. Because digital signals are transmitted using an analog signal along a transmission line, the predefined quantized states of the digital signal are represented by different ranges of voltages within the total voltage range of the signal. For example, a typical digital integrated circuit (IC) based on a binary system will communicate using two states—zero ("0") and one ("1"). The digital state of "0" is represented by the range of voltages between a minimum voltage $V_{MIN}$ (e.g., 0 volts) of the potential voltage range of the signal and a voltage $V_{LOW}$ that is low relative to the total range of voltage, whereas the digital state of "1" is represented by the range of voltages between a voltage $V_{HIGH}$ that is high relative to the total range of voltages and a maximum voltage $V_{MAX}$ (e.g., 1.5 volts) of the potential voltage range of the signal. In binary system example, the state of the digital signal is unknown when the voltage level of the signal is between $V_{LOW}$ and $V_{HIGH}$, which typically only occurs during transitions of the signal from either the "0" state to the "1" state or vice versa.

Because the transmission signal is actually analog, the transition between digital states does not occur instantaneously, but instead occurs over a period of time $T_{TRANSITION}$ that is dependent on the physical conditions present on the transmission line. It is well known that signal transitions over a transmission line will suffer a delay known as a propagation delay due to the parasitic resistance, inductance, and capacitance of the line. This delay increases with the length of the line. In addition, it is also well-known that unless the impedance of the transmission line matches that of the load it drives, the signal will degrade because the mismatch in impedance leads to reflections from the load that are passed back to the driver circuit, which may then be re-reflected causing further signal degradation.

Furthermore, when the driver circuit drives multiple loads with differing impedances, the transmission line requires multiple stubs to properly match each of the loads during realtime operation. However, the use of multiple stubs then generates multiple reflections. One way of ensuring proper detection of signal states is to control the edge rates of the signal.

However, this competes with the trend towards ever increasing signal frequencies, which results in higher edge rates. Accordingly, a need exists for a technique for controlling the slew rate of signal edge transitions without sacrificing the signal frequency.

SUMMARY OF THE INVENTION

The present invention is a method and circuit for controlling the slew rate of integrated circuit output drivers by controlling the resistance of a pre-driver circuit that generates the drive signal.

In particular, the present invention allows the ability to vary the slew rate of the signal on the output pad by controlling the current flow through a set of pre-driver FETs that driver the output stage FETs. In a preferred embodiment, this is accomplished using a programmable resistance pre-driver circuit to drive the output stage of the output driver. The slope of the pre-driver signal driving the output stage FETs is controllable by varying the source resistance of the pre-driver FETs.

In addition to controlling the slew rate of the output signal, the use of the programmable resistance pre-driver circuit may also be advantageous to overcome chip-to-chip parameter differences due to variations in voltage, temperature, and manufacturing process.

For even slower slew rate requirements, the invention may also implement a staged turn-on of the output driver legs. This gives a slower possible output slew rate than possible with edge rate control of a single output driver leg alone.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and circuits for controlling the slew rate of an output signal by an output driver is described in detail hereinafter. Although the invention is described in terms of specific illustrative embodiments, such as specific output driver designs, it is to be understood that the embodiments described herein are by way of example only and that the scope of the invention is not intended to be limited thereby but is intended to extend to any embodiment that controls the output signal edge rate by adjusting the resistance in the pre-driver circuit to control the slope of the pre-drive signal.

Figure 1:
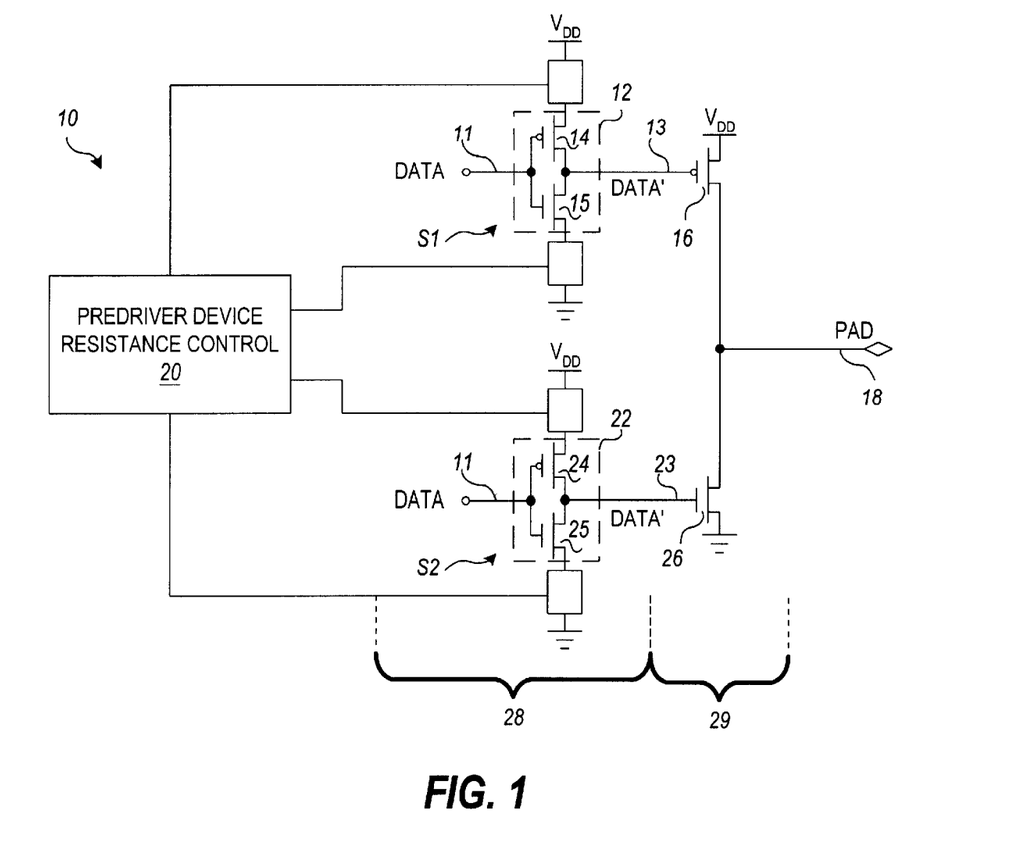
FIG. 1 is a block diagram of a slew rate controlled output driver circuit in accordance with the present invention.

Turning now to a general preferred embodiment, FIG. 1 depicts a slew rate controlled output driver circuit 10 implemented in accordance with the present invention. As will be described in detail hereinafter, the slew-rate controlled output driver circuit 10 provides the functionality for controlling the slew rate of the signal driven onto the output pad by controlling the source resistance of the pre-drive devices.

As known in the art, a typical output driver will include a pull-up circuit S1 and a pull-down circuit S2. Each circuit S1 and S2 will typically include a pre-driver stage 28 (typically implemented with an inverter 12, 22 comprising a pair of complementary CMOS devices 14,15 and 24, 25 respectively) having an input coupled to receive a data signal DATA 11. The pre-driver stage 28 produces pull-up and pull-down pre-drive signals 13, 23 used to control output driver pull-up and pull-down devices 16 and 26 in an output stage 29 which drives the output pad 18 to a high voltage level, a low voltage level, or possibly a tri-state voltage level. Typically the output stage 29 employs a pair of complementary CMOS devices 16 and 26 each having a gate connected to receive a respective pre-drive signal 13, 23, a drain connected to the output pad 18, and a source connected to alternate ones of either a high voltage source (e.g., $V_{DD}$) or a low voltage source (e.g., $V_{SS}$ or ground), as shown. In accordance with the invention, the pre-driver stage 28 is responsive to a pre-driver resistance control circuit 20 which adjusts the source resistance of the pre-driver stage devices 14, 15, and 24, 25 to speed up or slow down the rate of current flow through the pre-driver stage devices 14, 15, and 24, 25, respectively, in order to adjust the slew rate of the respective pull-up and pull-down pre-drive signals 13 and 23. This in turn directly affects the slew rate of the signal on the output pad 18.

Figure 2:
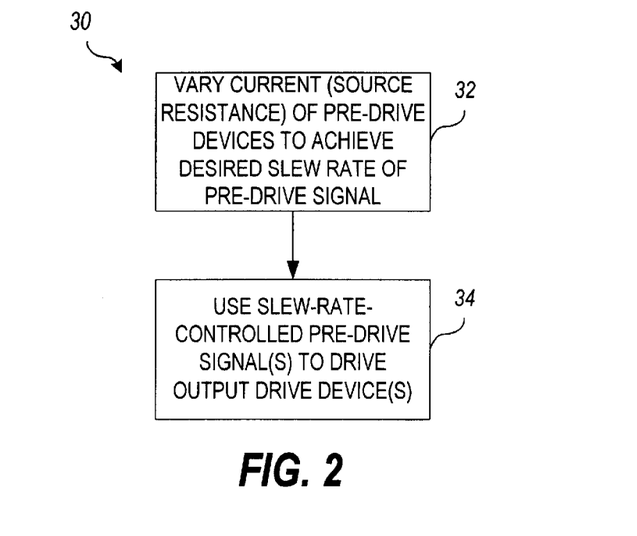
FIG. 2 is an operational flowchart of a method in accordance with the invention.

FIG. 2 is an operational flowchart of the general method of the invention. In accordance with the method, shown generally at 30, in a step 32, the source resistance of the pre-driver device(s) is varied to adjust the rate of current flowing through the pre-drive device(s) to achieve a desired slew rate of the edge(s) of the pre-drive signal(s). The slew-rate-controlled pre-drive signal(s) are then used to drive 34 the output driver device(s).

Figure 3:
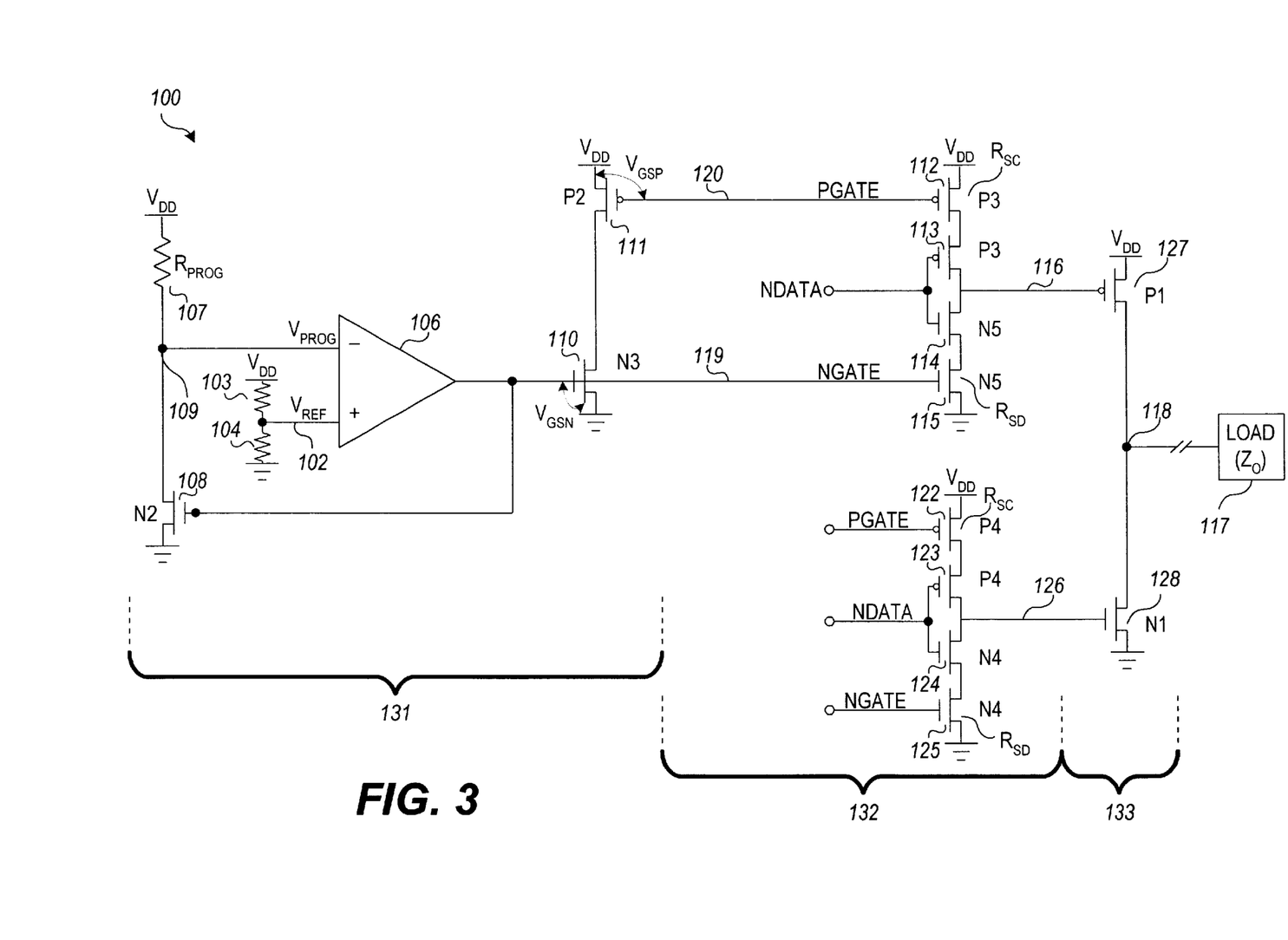
FIG. 3 is a schematic diagram of a slew-rate controlled output driver circuit implemented in accordance with the invention.

Turning now to a specific embodiment, FIG. 3 depicts an output driver 100 implemented in accordance with the principles of the present invention. As illustrated, the output driver 100 includes three stages: a programmable current source 131, a pre-driver stage 132, and an output stage 133.

Output stage 133 includes output drive devices 127 and 128 connected respectively between a high voltage source $V_{DD}$ and low voltage source (ground) and an output pad 118. The output drive devices 127 and 128 are controllable via the pre-driver stage 132 to drive output pad 118 which is connected to a load 117 having a characteristic impedance of $Z_O$. Programmable current source 131 determines a composite source impedance for the pre-driver stage 132. The composite source impedance of the pre-drive devices can be separated into a value $R_{SC}$ (the source resistance while charging) and a value $R_{SD}$ (the source resistance while discharging). Generally speaking, it is desirable that $R_{SC}$ and $R_{SD}$ be equal to each other, although one can imagine that there might be special circumstances that would require them to be different. $R_{SC}$ and $R_{SD}$ may be varied, as described in detail hereinafter, to alter the slope of the output on the pre-driver stage 132. If $R_{SC}/R_{SD}$ is increased, the slope of the output 116, 126 of the predriver stage 132 decreases and therefore the transition time of the pre-drive signal 116, 126 increases. Conversely, if $R_{SC}/R_{SD}$ is decreased, the slope of the output 116,126 of the predriver stage 132 increases and therefore the transition time of the pre-drive signal 116,126 decreases.

In the pull-up portion of the circuit, the pre-driver circuit 132 comprises four CMOS devices 112–115 in series. Devices 113 and 114 act as switches to respectively pull up (charge to $V_{DD}$) and pull down (discharge to ground) the pre-drive signal on line 116 that drives the pull-up device 127 of the output stage. It will be understood that switching devices 113 and 114 are driven on and off in suitable alternation in accordance with the desired output waveform (which represents the bit pattern of the data being output), and that although both devices 113 and 114 may be off to tri-state pre-drive signal on line 116, both devices will never be on at the same time. Device 112 acts as a resistance of programmable value to combine with the very low on-resistance of device 113 to produce $R_{SC}$. Similarly, device 115 acts as a resistance of programmable value to combine with the relatively low on-resistance of device 114 to produce $R_{SD}$. The resistance of device 112, having generally equal transconductance as device 115, is controlled by the value of the voltage PGATE 120, while in similar fashion the resistance of device 115 is determined by the value of the voltage NGATE 119.

Turning now to the programmable current source 131, a voltage $V_{REF}$ 102 is derived from $V_{DD}$ by a voltage divider including two resistive devices 103 and 104, that are connected in series between $V_{DD}$ and GND. The geometry of these two devices is chosen to produce, for a $V_{DD}$ of say, 3.3 V, a $V_{REF}$ of 1.8 V.

An external programming resistor $R_{PROG}$ 107 is connected between an external source of $V_{DD}$ and a terminal 109 of the chip, characterized by voltage $V_{PROG}$. The voltage $V_{PROG}$ is produced by a feedback controlled voltage divider formed by the external programming resistor $R_{PROG}$ 107 and an N-type device 108 having a drain connected to terminal 109 and a source connected to ground. $V_{PROG}$ and $V_{REF}$ are applied to an error amplifier 106 (an operational amplifier of suitable gain) whose output is the signal NGATE 119. NGATE is applied to the gate of n-type device 108.

In operation, $V_{PROG}$ equals $V_{REF}$, within the error limits of the feedback loop. A gain of forty in the error amplifier 106 is a reasonable gain and will keep $V_{PROG}$ 109 within, say, 50 mv of $V_{REF}$. Second, the characteristics of device 108 are included in the feedback loop. This means that the gate voltage $V_{GSN}$ (which is also NGATE 119) varies as needed to advantageously null variations in $V_{PROG}$ that are due parameter shifts in device 108 arising from temperature and process variations. Thus, NGATE varies in a way that can be used to supply compensation to other devices that experience generally identical parameter shifts for those same process and temperature excursions.

So, for example, if device 108 is considered "fast" (i.e., the current through the device is relatively large for a given $V_{GSN}$) compared to a hypothetical design center device, the voltage $V_{PROG}$ will tend to be lower than it would otherwise be (which is set at $V_{REF}$ by the feedback loop). (Presumably, devices 112 and 115 will also be "fast", which causes them to exhibit decreased values for $R_{SC}$ and $R_{SD}$, which is undesirable.) However, if $V_{PROG}$ decreases below $V_{REF}$, the error amplifier will decrease the value of NGATE and raise the resistance of device 108 to increase $V_{PROG}$ back to near $V_{REF}$. As will be seen, decreasing the value of NGATE increases the resistance of devices 112 and 115. This is what is wanted, since they are also "fast", having been fabricated in the same process, and would otherwise then presumably operate with a resistance lower than desired. Similar examples are obtained for "slow" devices, as well as for shifts produced by temperature excursions.

Accordingly, by including device 108 in the feedback loop for $V_{REF}$, variations in NGATE are produced that can be used for compensation of deviation away from a programmed value of source impedance.

Returning now to the novel aspects of the invention, $R_{PROG}$ may be varied to adjust the source resistances $R_{SC}$ and $R_{SD}$ affecting the rate of current flow by pre-drive drive devices 113 and 114. The slew rate of the pre-drive signal 116 can be adjusted by programming the source resistance $R_{SC}$ and $R_{SD}$ of the pre-drive devices 113, 114 which affects the rate of charge/discharge of the pre-drive signal 116. By slowing down the charge/discharge rate of the pre-drive signal 116, it takes longer to charge/discharge the gates of the output signal drive device 127, and therefore increases the amount of time over which the output signal drive device 127 conducts in the linear region before reaching saturation/pinch-off. As known in the art, the range of the gate-to-source voltage $V_{GS}$ defining the linear region of a FET device is small, and the drain current increases linearly with the drain-to-source voltage $V_{DS}$ up to a saturation voltage $V_{DS(sat)}$ at which point the FET becomes a current source. The slope in the linear region, $I_D/V_{DS}$, is proportional to $V_{GS}-V_T$. Accordingly, the longer the drive device 127, 128 remains in the linear region, the slower the charge/discharge rates will be on the output pad, and therefore the slower the edge rates of the output signal.

The pull-down portion of the circuit 100 is similar to the pull-up portion of the circuit, including predriver devices 122–125 connected in series between high-voltage source $V_{DD}$ and ground and generating a pre-drive signal 126 which drives the gate of drive device 128. The pull-down portion of the circuit operates similarly to the pull-up portion of the circuit, except that the drive device 128 discharges the output pad to ground.

Figure 4A:
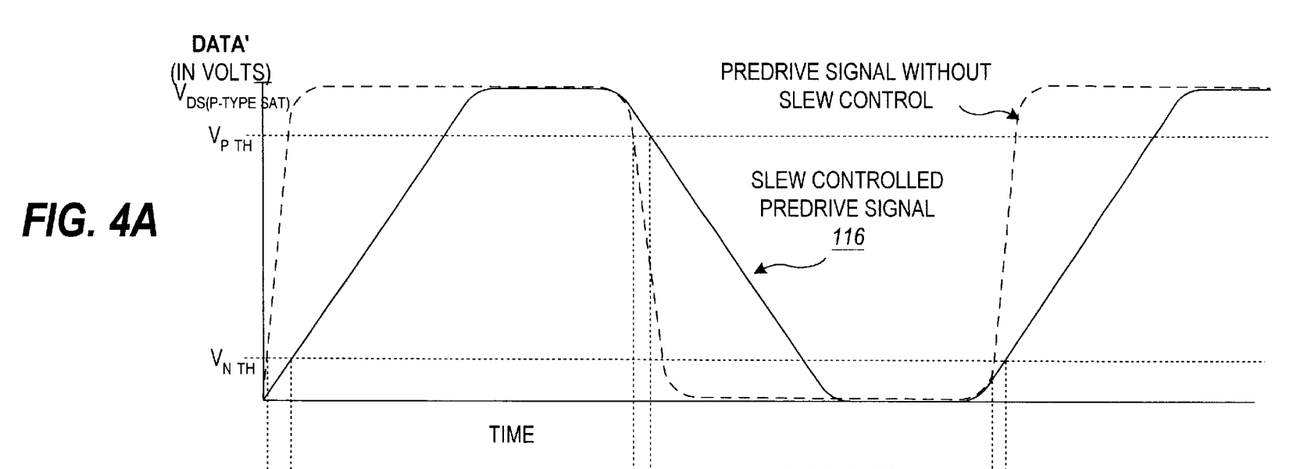
FIG. 4A is a gate-voltage-vs.-timing diagram illustrating a pre-drive signal due to operation of the invention of the first embodiment of the invention shown in FIG. 3.
Figure 4B:
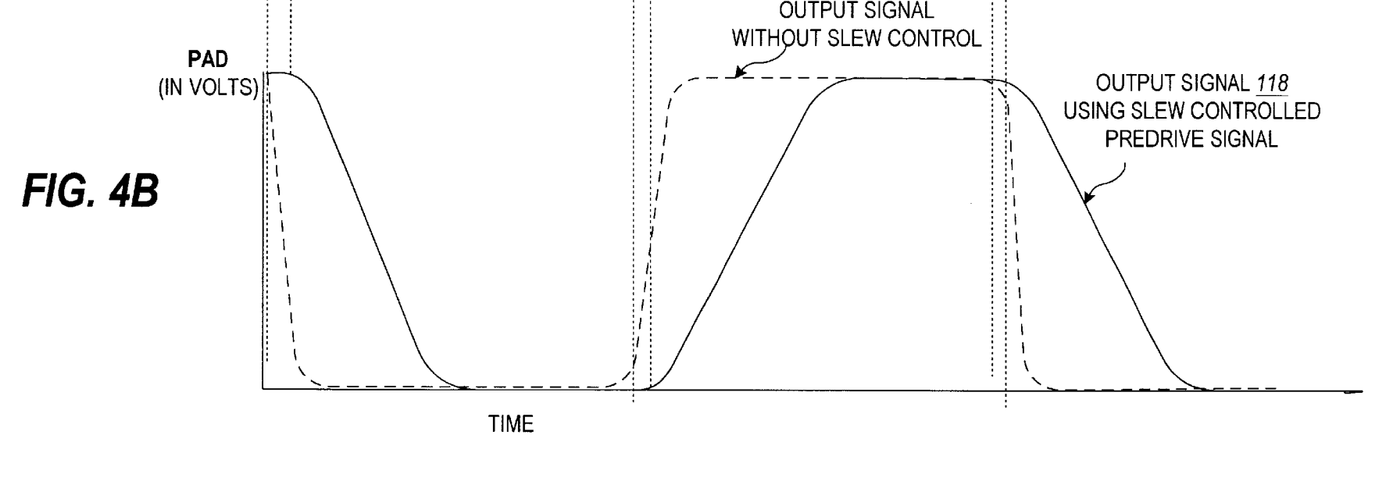
FIG. 4B is a gate-voltage-vs.-timing diagram illustrating the output signal corresponding to the pre-drive signal of FIG. 4A using the first embodiment of the invention shown in FIG. 3.

FIGS. 4A and 4B are timing diagrams illustrating the effect of increasing the source resistance of the pre-drive devices on the edge rate of the output signal. As illustrated, without slew rate control, the pre-drive signal (shown by the dashed line in FIG. 4A) switches quickly, resulting in sharp edge transitions. This leads to sharp edge transitions in the output signal (shown by the dashed line in FIG. 4B). In contrast, with the invention's slew rate control of the pre-drive signal (indicated by the solid line in FIG. 4A), the output signal (indicated by the solid line in FIG. 4B) transitions more slowly.

Returning again to FIG. 3, the programmable current source 131 is implemented such that devices 108 and 110 comprise a 1:1 current mirror. Device 110 is operated in a region where it tends to behave as a constant current source, where the value of the current is a function of $V_{GSN}$ (i.e., of NGATE). That is, the current through device 110 (and 111, too) will be $I_{PROG}$, but as adjusted (for compensation) by any movement in $V_{GSN}$ produced by the error amplifier 6 as it servos $V_{PROG}$ to track $V_{REF}$. Device 111 also operates in a constant current region, and owing to symmetry of construction, it will have the same magnitude gate voltage at a given current as does device 110. Since devices 110 and 111 are connected in series, as constant current sources they produce and share exactly the same current. Thus, the current through device 110 produces, or is accompanied by, gate voltage $V_{GSP}$ (PGATE) for device 111 that, when referenced to $V_{DD}$, corresponds in magnitude and direction of change to $V_{GSN}$ referenced to DGND. In other words, devices 110 and 111 operate as a gate voltage mirror. The results are signals NGATE 119 and PGATE 120 whose values are determined in a major fashion according to the value selected for $R_{PROG}$ and that vary in a minor fashion according to variations in process and temperature.

The signal NGATE 119 drives the gate of the n-channel FET 115, while the signal PGATE 120 drives the gate of the p-channel FET 112. Devices 108 and 115 also constitute a current mirror with a current ratio proportional to the ratio of the geometries of the devices. For example, suppose that the geometries selected for FET 115 generates a 1:30 mirror. The current that flows through FET 115 (when allowed by device 114 being on) is thirty times the amount of current flowing through device 108 ($I_{PROG}$). In this example, the geometries of devices 108 and 112 are chosen to also constitute a 1:30 current mirror. Hence, $R_{PROG}$ sets $I_{PROG}$, which in turn programs and also compensates the values of $R_{SC}$ for device 112 and $R_{SD}$ for device 115.

Figure 5:
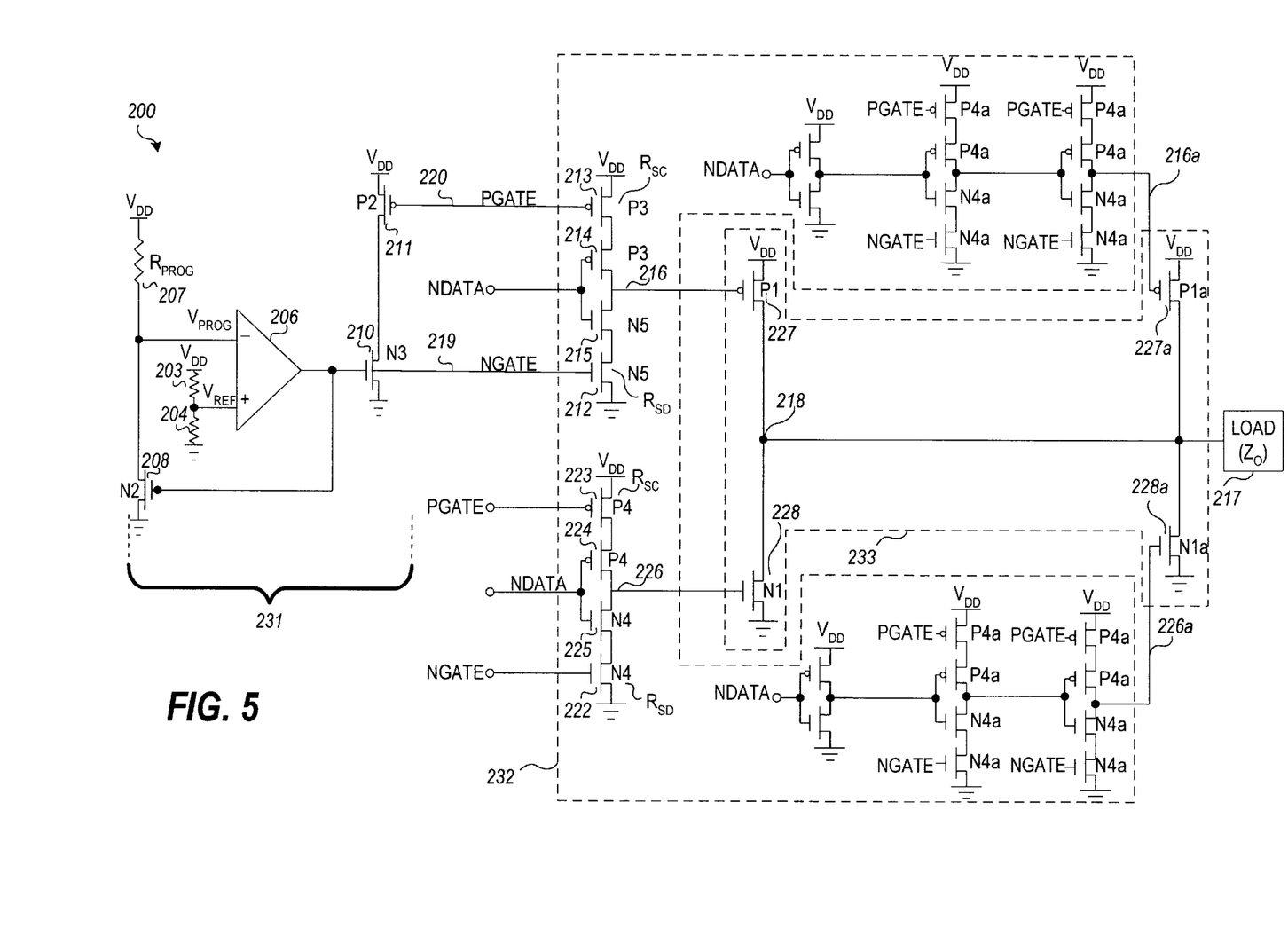
FIG. 5 an alternative embodiment of a slew rate controlled output driver circuit implemented in accordance with the invention.

In some applications, for example buses that have a very slow slew rate requirement and/or have multiple loads on the bus, additional measures for slowing the slew rates is needed. FIG. 5 is an alternative embodiment of a slew rate controlled output driver circuit 200 in accordance with the invention that employs multiple staged-turn-on/off output driver drive devices 227, 227a, and 228, 228a to pull up or pull down the output pad 218 of the driver. In this embodiment, output driver 200 includes a programmable current source 231, a pre-driver stage 232, and an output stage 233. The output stage 233 includes a plurality of pull-up devices 227, 227a, connected between a high voltage source $V_{DD}$ and the output pad 218, and a plurality of pull-down devices 228, 228a, connected between a low voltage source (ground) and output pad 118. The output drive devices 227, 227a, 228, 228a, are each controllable via respective corresponding pre-drive circuits which belong to the pre-driver stage 232 whose respective source impedances $R_{SC}$ and $R_{SD}$ are programmable via the programmable current source 231 according to the principles discussed above with respect to the embodiment of FIG. 3. As in the embodiment of FIG. 3, by setting up known ratios between the current mirrored devices (i.e, the ratios between devices 208 and 210, 208 and 211, 208 and 213, and 208 and 212, a single programmable resistor $R_{PROG}$ may be used to control the slew rate of each of the pre-drive signals 216, 216a, 226, 226a such that output drive devices 227, 227a, and 228, 228a turn on/off in a staged manner.

It will be appreciated that one programmable current source 231 may serve to set, and also maintain through compensation, the drive level (source impedance) of an arbitrary plurality of output driver stages; e.g., for an entire bus. It will further be appreciated that there could easily be multiple arbitrary pluralities of output driver stages, with each such multiple having a source impedance that is independently controlled by an associated separate programmable current source.

Figure 6A:
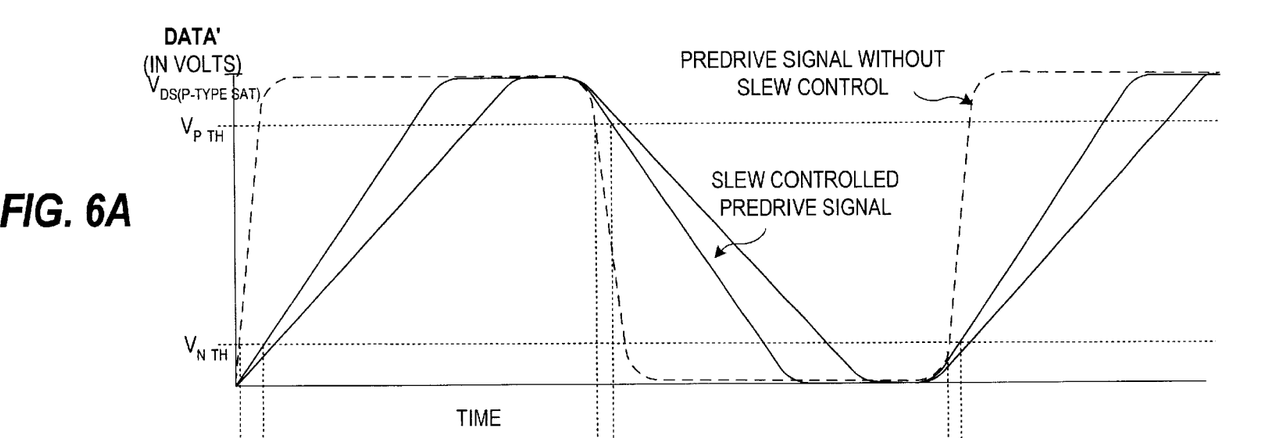
FIG. 6A is a gate-voltage-vs.-timing diagram illustrating a pre-drive signal due to operation of the invention of the second embodiment of the invention shown in FIG. 5.
Figure 6B:
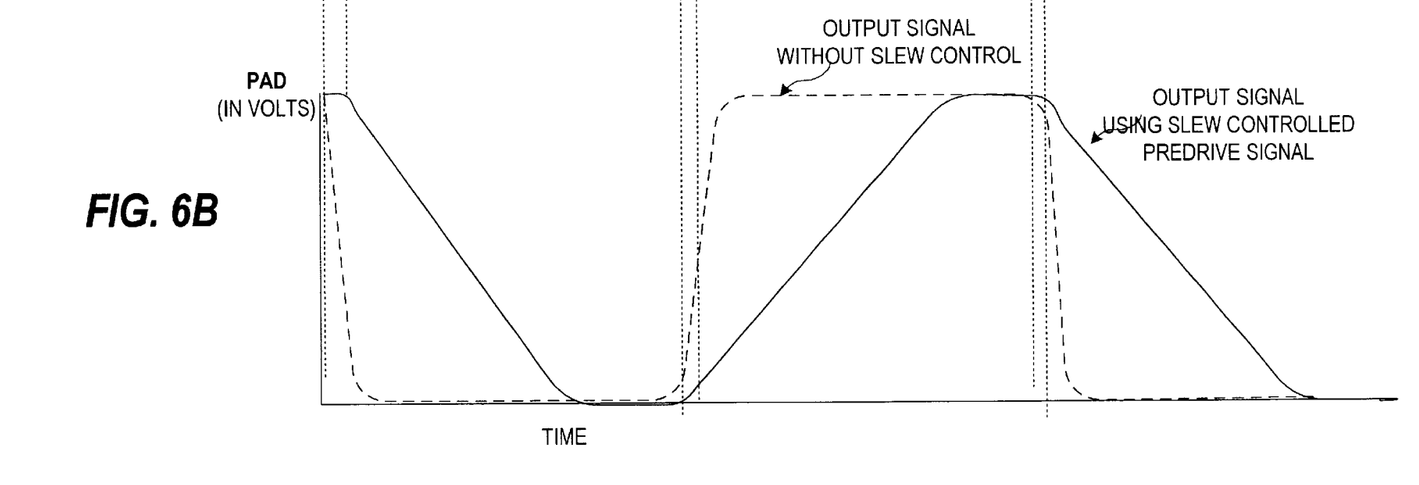
FIG. 6B is a gate-voltage-vs.-timing diagram illustrating the output signal corresponding to the pre-drive signal of FIG. 4A using the second embodiment of the invention shown in FIG. 5.

FIGS. 6A and 6B are timing diagrams illustrating the effect of increasing the source resistance of the multi-staged pre-drive devices on the edge rate of the output signal. As illustrated, without slew rate control, the pre-drive signal (shown by the dashed line in FIG. 6A) switches quickly, resulting in sharp edge transitions, leading to sharp edge transitions in the output signal (shown by the dashed line in FIG. 6B). In contrast, with the invention's slew rate control of the pre-drive signal with staged turn-on (indicated by the solid line in FIG. 6A), the output signal (indicated by the solid line in FIG. 6B) transitions more slowly.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An apparatus for varying the slew rate of transition edges of a digital signal on a node of an integrated circuit, comprising:

a first pre-drive device which generates a first pre-drive signal;

a first output drive device controllable by sad first pre-drive signal to generate said digital signal on said node; and a pre-drive device controller comprising a programmable source resistance controller which controls a first source resistance of said first pre-drive device to adjust a slope of said first pre-drive signal to vary the slew rate of said transition edges of said digital signal on said node of said integrated circuit, said programmable source resistance controller comprising a programmable current source that is adjustable via an external resistor and which controls said first source resistance of said first pre-drive device.

2. An apparatus in accordance with claim 1, comprising:

one or more additional pre-drive devices each of which generates a corresponding one or more additional pre-drive signal; and one or more additional output drive devices each controllable by at least one of said one or more additional pre-drive signals to generate said digital signal on said node;

wherein said programmable source resistance controller of said pre-drive device controller controls a respective source resistance of each of said respective one or more additional pre-drive devices.

3. An apparatus in accordance with claim 2, wherein said source resistance controller comprises a programmable current source which controls said first source resistance associated with said first pre-drive device and said one or more additional source resistances associated with said one or more additional pre-drive devices.

4. An apparatus for varying the slew rate of transition edges of a digital signal on a node of an integrated circuit, comprising:

a first output transistor having a first output transistor source coupled to a first driving voltage source, a first output transistor drain coupled to said node, and a first output transistor gate;

a first pre-drive device having a first pre-drive device input coupled to receive a data signal, a first pre-drive device output coupled to said first output transistor gate on which a first pre-drive output signal is generated, and a first pre-drive device control input, wherein said first pre-drive device comprises:

a first pre-drive transistor having a first pre-drive transistor source, a first pre-drive transistor drain coupled to said first output transistor gate, and a first pre-drive transistor gate coupled to receive said data signal; and a second pre-drive transistor having a second pre-drive transistor source, a second pre-drive transistor drain coupled to said first output transistor gate, and a second pre-drive transistor gate coupled to receive said data signal, wherein said first pre-drive transistor and said second pre-drive transistor comprise opposite ones of an n-type transistor and a p-type transistor; and a first programmable source resistance controller coupled to said first pre-drive device control input which adjusts a first pre-drive device source resistance of said first pre-drive device based on a programmed signal in order to adjust a slope of said first pre-drive output signal to vary the slew rate of said transition edges of said digital signal on said node of said integrated circuit, wherein said first source resistance controller comprises:

an operational amplifier having a first input coupled to receive a reference signal, a second input coupled to a receive said programmed signal, and an operational amplifier output on which a difference signal representing a difference between said reference signal and said programmed signal is generated;

a first transistor having a first transistor source coupled to a first voltage source, a first transistor gate coupled to said operational amplifier output, and a first transistor drain coupled to said first input of said operational amplifier which receives said reference signal;

a second transistor having a second transistor source coupled to said first voltage source, a second transistor gate coupled to said operational amplifier output, and a second transistor drain;

a third transistor having a third transistor source coupled to a second voltage source, a third transistor drain coupled to said second transistor drain, and a third transistor gate;

a fourth transistor having a source coupled to said first voltage source, a fourth transistor drain coupled to said first pre-drive transistor source, and a fourth transistor gate coupled to said operational amplifier output and said second transistor gate; and a fifth transistor having a source coupled to said second voltage source, a fifth transistor drain coupled to said second pre-drive transistor source, and a fifth transistor gate coupled to said third transistor gate.

5. An apparatus in accordance with claim 4, comprising:

a second output transistor having a second output transistor source coupled to a second driving voltage source, a second output transistor drain coupled to said node, and a second output transistor gate;

a second pre-drive device having a second pre-drive device input coupled to receive said data signal, a second pre-drive device output coupled to said second output transistor gate, and a second pre-drive device control input; and a second programmable source resistance controller coupled to said second pre-drive device control input which determines a second pre-drive device source resistance of said second pre-drive device based on said programmed signal, wherein said second pre-drive device comprises:

a third pre-drive transistor having a third pre-drive transistor source, a third pre-drive transistor drain coupled to said second output transistor gate, and a third pre-drive transistor gate coupled to receive said data signal; and a fourth pre-drive transistor having a fourth pre-drive transistor source, a fourth pre-drive transistor drain coupled to said second output transistor gate, and a fourth pre-drive transistor gate coupled to receive said data signal, wherein said third pre-drive transistor and said fourth pre-drive transistor comprise opposite ones of an n-type transistor and a p-type transistor; and said second source resistance controller comprises:

a sixth transistor having a source coupled to said first voltage source, a sixth transistor drain coupled to said third pre-drive transistor source, and a sixth transistor gate coupled to said operational amplifier output and said second transistor gate; and a seventh transistor having a source coupled to said second voltage source, a seventh transistor drain coupled to said fourth pre-drive transistor source, and a seventh transistor gate coupled to said third transistor gate.

6. An apparatus in accordance with claim 5, wherein:

said second driving voltage source is substantially equal to said first driving voltage source.

7. An apparatus in accordance with claim 5, comprising:

an external programming resistor having a first terminal coupled to an external voltage source and a second terminal coupled to said first input of said operational amplifier and said first transistor drain.

8. An apparatus in accordance with claim 4, comprising:

an external programming resistor having a first terminal coupled to an external voltage source and a second terminal coupled to said first input of said operational amplifier and said first transistor drain.

* * * * *